(12) United States Patent
Melamed et al.

(10) Patent No.: US 8,361,556 B2
(45) Date of Patent: Jan. 29, 2013

(54) FLEXOGRAPHIC PRINTING PRECURSORS AND METHODS OF MAKING

(75) Inventors: Ophira Melamed, Shoham (IL); Ido Gal, Kafar-Saba (IL); Limor Dahan, Tel Aviv (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/188,617

(22) Filed: Jul. 22, 2011

(65) Prior Publication Data

US 2011/0274845 A1 Nov. 10, 2011

Related U.S. Application Data

(62) Division of application No. 12/748,475, filed on Mar. 29, 2010.

(51) Int. Cl.
*B05D 3/02* (2006.01)
(52) U.S. Cl. .................... 427/385.5; 427/389.9
(58) Field of Classification Search ............... 427/385.5, 427/389.9
See application file for complete search history.

(56) References Cited

U.S. PATENT DOCUMENTS

| | | | |
|---|---|---|---|
| 4,323,636 A | 4/1982 | Chen | |
| 4,934,267 A | 6/1990 | Hashimoto et al. | |
| 5,239,000 A * | 8/1993 | Kim et al. ................. | 525/133 |
| 5,259,311 A | 11/1993 | McCaughey, Jr. | |
| 5,719,009 A | 2/1998 | Fan | |
| 5,798,202 A | 8/1998 | Cushner et al. | |
| 5,804,353 A | 9/1998 | Cushner et al. | |
| 6,223,655 B1 | 5/2001 | Shanbaum et al. | |
| 6,776,095 B2 | 8/2004 | Telser et al. | |
| 6,913,868 B2 | 7/2005 | Leinenbach et al. | |
| 6,935,236 B2 | 8/2005 | Hiller et al. | |
| 7,223,524 B2 | 5/2007 | Hiller et al. | |
| 7,290,487 B2 | 11/2007 | Hiller | |
| 7,419,766 B2 | 9/2008 | Kimelblat et al. | |
| 2002/0018958 A1 | 2/2002 | Nishioka et al. | |
| 2003/0104151 A1 * | 6/2003 | Buono et al. ................ | 428/36.91 |
| 2003/0116044 A1 * | 6/2003 | Buono et al. ................ | 101/395 |
| 2004/0231540 A1 | 11/2004 | Hiller | |
| 2008/0153038 A1 | 6/2008 | Siman-Tov et al. | |
| 2008/0194762 A1 | 8/2008 | Sugasaki | |
| 2008/0258344 A1 | 10/2008 | Regan et al. | |
| 2008/0305436 A1 | 12/2008 | Shishkin | |
| 2009/0057268 A1 | 3/2009 | Aviel | |
| 2009/0101034 A1 | 4/2009 | Aviel | |
| 2009/0214983 A1 | 8/2009 | Figov et al. | |
| 2011/0014573 A1 | 1/2011 | Matzner et al. | |
| 2011/0058010 A1 | 3/2011 | Aviel et al. | |

FOREIGN PATENT DOCUMENTS

| | | |
|---|---|---|
| EP | 1 228 864 | 8/2002 |
| WO | 2005/084959 | 9/2005 |
| WO | 2007/149208 | 12/2007 |

OTHER PUBLICATIONS

S.E. Nielsen, "Laser Material Processing of Polymers" *Polymer Testing 3* (1983) 303-310.
W. Kern et al, "Laser Engraving of Rubbers—The Influence of Fillers" (Rohstoffe Und Anwendendunghen) Oct. 1997, 710-715.

* cited by examiner

*Primary Examiner* — Robert S Walters, Jr.
(74) *Attorney, Agent, or Firm* — J. Lanny Tucker

(57) ABSTRACT

A mixture of a high molecular weight EPDM rubber with a low molecular weight (liquid) EPDM rubber provides a highly useful laser-ablatable flexographic printing plate precursor formulation. This formulation is sensitive to infrared radiation by the incorporation of an IR absorbing compound such as a carbon black. The inclusion of the liquid EPDM rubber avoids the need for plasticizers such as process oils during manufacturing, and provides improved image sensitivity, print quality, and run length. Both flexographic printing plates and printing sleeves can be made using the mixture of EPDM rubbers.

9 Claims, No Drawings

FLEXOGRAPHIC PRINTING PRECURSORS AND METHODS OF MAKING

CROSS-REFERENCE TO RELATED APPLICATIONS

This application is a divisional of prior U.S. patent application Ser. No. 12/748,475, filed Mar. 29, 2010, entitled "Flexographic Printing Precursors and Methods Of Making", which is hereby incorporated herein by reference in its entirety.

FIELD OF THE INVENTION

This invention relates to flexographic printing precursors in the form of either plates or sleeves that contain an IR-ablatable relief-forming layer comprising a mixture of rubbery resins. This invention also relates to a method of preparing these flexographic printing precursors in either plate or sleeve form.

BACKGROUND OF THE INVENTION

Flexography is a method of printing that is commonly used for high-volume printing runs. It is usually employed for printing on a variety of substances particularly those that are soft and easily deformed, such as paper, paperboard stock, corrugated board, polymeric films, fabrics, plastic films, metal foils, and laminates. Course surfaces and stretchable polymeric films can be economically printed by the means of flexography.

Flexographic printing plates are sometimes known as "relief printing plates" and are provided with raised relief images onto which ink is applied for application to the printing substance. The raised relief images are inked in contrast to the relief "floor" that remains free of ink in the desired printing situations. Such printing plates are generally supplied to the user as a multi-layered article having one or more imageable layers coated on a backing or substrate. Flexographic printing can also be carried out using a flexographic printing cylinder or seamless sleeve having the desired raised relief image. These flexographic printing cylinder or sleeve precursors can be "imaged in-the-round" (ITR), either by using a standard photomask or a "laser ablation mask" (LAM) imaging on a photosensitive plate formulation, or by "direct laser engraving" (DLE) of a plate precursor that is not necessarily photosensitive.

U.S. Pat. No. 5,719,009 (Fan) describes elements having an ablatable layer disposed over photosensitive layer(s) so that after image ablation, UV exposure of the underlying layer hardens it while non-exposed layer(s) and the ablatable mask layer are subsequently washed away.

DuPont's Cyrel® FAST™ thermal mass transfer plates are commercially available photosensitive resin plate precursors that comprise an integrated ablatable mask element and require minimal chemical processing, but they do require thermal wicking or wiping to remove the non-exposed areas. These also require extensive disposal of polymeric waste and some drying of the processed (developed) plates.

There remains a need for a totally processless method of producing flexographic printing plates with high throughput efficiency. A method for forming a relief pattern on a printing element by directly engraving (DE) with a laser is already used to produce relief plates and stamps. However, the requirement of relief depths in excess of 500 μm challenges the speed at which these flexographic printing plate precursors can be imaged. In contrast to the laser ablation of the CTP mask layers atop the photosensitive resin, which only requires low energy lasers and low fluence, the DE of laser ablatable flexographic printing plates requires higher energy lasers and higher fluence. In addition, the laser ablatable, relief-forming layer becomes the printing surface and must have the appropriate physical and chemical properties needed for good printing. The laser engravable black mask layer is washed away during the development and is not used during the printing.

Flexographic printing plate precursors used for infrared radiation (IR) laser ablation engraving must comprise an elastomeric or polymeric composition that includes one or more infrared radiation absorbing compounds. When the term "imaging" is used in connection with "laser engraving", it refers to ablation of the background areas while leaving intact the areas of the element that will be inked and printed in a flexographic printing station or press.

Commercial laser engraving is typically carried out using carbon dioxide lasers. While they are generally slow and expensive to use and have poor beam resolution, they are used because of the attractions of direct thermal imaging. Infrared (IR) fiber lasers are also used. These lasers provide better beam resolution, but are very expensive. IR laser engravable flexographic printing plate blanks having unique engravable compositions are described in WO 2005/084959 (Figov).

Direct laser engraving is described, for example, in U.S. Pat. Nos. 5,798,202 and 5,804,353 (both Cushner et al.) in which various means are used to reinforce the elastomeric layers. The reinforcement can be done by addition of particulates, by photochemical reinforcement, or by thermochemical hardening. U.S. Pat. No. 5,804,353 describes a multilayer flexographic printing plate wherein the composition of the top layer is different from the composition of the intermediate layer. Carbon black can be used as a reinforcing agent and can be present in both layers.

Flexographic printing plate precursors for near-IR laser ablation engraving generally comprise an elastomeric or polymeric system that is made thermosetting by a polymerization reaction and includes fillers and infrared absorbing compounds. During recent years, infrared laser diodes have been used for ablation of thin layers (U.S. Pat. No. 5,339,737 of Lewis et al.) for use in offset lithographic printing. These lasers are becoming increasingly inexpensive and more powerful and consequently are becoming more useful for laser ablation of thick layers such as are found in flexographic printing precursors. Such lasers require the presence of radiation absorbing dyes or pigments in the flexographic printing precursors as they generally operate around wavelengths of 800 nm to 1200 nm. They have the potential to enable faster imaging, higher print quality, and more reliable engraving than obtained with carbon dioxide lasers. In addition, it is advantageous to optimize imaging speed by formulating printing plates with higher sensitivity. This will give higher productivity in printing plate production with the potential of greater profits for the printing houses or trade shops where the printing plates may be produced. Imaging systems can be made by using arrays of laser diodes. Throughput also depends on the number of laser diodes being used and there is a balance between the cost of imaging heads that depends on the number of diodes and their combined output power. The requirement for high print quality has increased considerably in recent years as flexographic printing penetrates markets previously dominated by high quality offset lithography. Laser engraving using infrared diodes instead of carbon dioxide provides an opportunity for higher quality because the wavelength of the diode radiation at 800-1000 nm is so much smaller than that of carbon dioxide of 10.7 μm.

As mentioned above, the chosen commercial means of imaging by laser engraving has for some years been with carbon dioxide lasers. These are capable of ablating layers to produce suitable relief depths for flexographic printing. Such depths may be anywhere in the range from 200 μm to 5 mm. As carbon dioxide lasers operate at a wavelength of 10.7 μm, there is no need to incorporate infrared absorbing dyes or pigments into the printing precursors because the polymers themselves absorb at this wavelength for ablation.

Although patents concerned with formulating laser-engraved printing precursors may mention laser diode engraving, they have been primarily aimed at carbon dioxide laser imaging and thus include formulations lacking infrared absorbing materials as described in U.S. Pat. No. 5,259,311 (MacCaughey). Formulations designed for ablation by carbon dioxide lasers cannot be easily modified for laser diode ablation by simply adding a suitable infrared radiation absorbing material. For instance, infrared dyes may react with the chemistry used to vulcanize the last-ablatable layer, or carbon black may block UV radiation used for curing the flexographic precursor composition.

One approach to formulation of laser-engravable flexographic printing precursors is to produce thermoplastic formulations that have not been crosslinked to form thermoset materials. These have been found to be of limited suitability for laser engraving because ablation of thermoplastic materials results in melted portions around the ablated areas and sometimes re-deposition of ablated material onto the ablated areas. This is because it is inevitable that during imaging there is heat flowing to non-imaged areas that is insufficient for ablation but sufficient for melting, as described in U.S. Patent Application Publication 2004/0231540 (Hiller et al.).

A number of elastomeric systems have been considered for construction of laser-engravable flexographic printing precursors. The earliest formulations included natural rubbers (as reported in U.S. Pat. No. 6,223,655 by Shanbaum et al. using a mixture of epoxidized natural rubber and natural rubber). Also, engraving of a rubber is described in "Laser Material Processing of Polymers" by S. E. Nielsen in *Polymer Testing* 3 (1983) 303-310.

U.S. Pat. No. 4,934,267 (Hashimito) describes the use of natural rubber or synthetic rubber or mixtures of both and specifically mentions acrylonitrile-butadiene, styrene-butadiene and chloroprene with a textile support. "Laser Engraving of Rubbers—The influence of Fillers" by W. Kern et al., October 1997, pp. 710-715 (Rohstoffe Und Anwendendunghen) described the use of natural rubber, nitrile rubber (NBR), ethylene-propylene-diene terpolymer (EPDM), and styrene-butadiene copolymer (SBR). The article entitled "Laser Engraving of Rubbers—The Use of Microporous Materials" by Kern et al., 1998 described the use of natural rubber compounds and EPDM.

EP1,228,864B1 (Houstra) describes liquid photopolymer mixtures designed for analogue UV imaging, cured with UV, and then the resulting plates are laser engraved using carbon dioxide. Such printing plate precursors do not contain infrared absorbing dyes or pigments and therefore are unsuitable for use with IR emitting laser diode systems. U.S. Pat. No. 5,798,202 (noted above) describes reinforced block copolymers incorporating carbon black that is UV cured and is still thermoplastic. As pointed out in U.S. Pat. No. 6,935,236 (Hiller et al.), such curing would be defective due to the high absorption of UV as it traverses through the thick precursor layer. The block copolymers described in Cushner et al. are the basis of most commercial UV-imageable flexographic printing precursors. Although many polymers are suggested for this use in the prior art, only polymers that are extremely flexible such as elastomers have been used commercially. This is because flexographic layers that are millimeters thick need to be bent around a printing cylinder and secured with temporary bonding tape that must both be removable after printing and secure the printing plate during printing.

U.S. Pat. No. 6,776,095 (Telser et al.) lists a number of elastomers including EPDM and U.S. Pat. No. 6,913,869 (Leinenbach et al.) describes the use of EPDM rubber for the production of flexographic printing plates having a flexible metal support. U.S. Pat. No. 7,223,524 (Hiller et al.) describes the use of natural rubber with highly conductive carbon blacks with specific properties of structure and surface area. U.S. Pat. No. 7,290,487 (Hiller et al.) lists suitable hydrophobic elastomers with inert plasticizers. U.S. Patent Application Publication 2002/0018958 (Nishioki et al.) describes a peelable layer and the use of rubbers such as EPDM and NBR together with inert plasticizers such as mineral oils. The use of inert plasticizers or mineral oils can present a problem as they leach out either during precursor grinding (during manufacture) or during storage, or under the pressure and contact with ink during printing.

An increased need for higher quality flexographic printing precursors for laser engraving has highlighted the need to increase the desire to solve performance problems that may have been of less importance when quality demands were less. What is especially difficult is to simultaneously improve the flexographic printing precursor in all directions.

For example, the rate of imaging is now an important consideration in laser engraving of flexographic printing precursors. Throughput by engraving depends upon printing plate width because it is imaged point by point. Conventional printing plates made by UV exposure followed by multiprocessing wash-out and drying is time consuming but is independent of printing plate size, and for the production of multiple printing plate, it can be relatively fast because many printing plates can be passing through the multiple stages at the same time. Throughput for flexographic engraving is somewhat determined by the equipment that is used but if this is the means for improving imaging speed, then cost becomes the main factor. Improved imaging speed is related to equipment cost. There is a limit to what the market will bear in equipment cost in order to have faster imaging. Therefore, much work has been done to try to improve the sensitivity of the flexographic printing plate by various means. For instance, U.S. Pat. No. 6,159,659 (Gelbart) describes the use of a foam layer for laser engraving so that there is less material to ablate. U.S. Pat. No. 6,806,018 (Kanga) uses expandable microspheres to increase sensitivity.

U.S. Patent Application Publication 2009/0214983 (Figov et al.) describes the use of additives that thermally degrade to produce gaseous products. U.S. Patent Application Publication 2008/0194762 (Sugasaki) suggests that good imaging sensitivity can be achieved using a polymer with a nitrogen atom-containing hetero ring. U.S. Patent Application Publication 2008/0258344 (Regan et al.) describes laser-ablatable flexographic printing precursors that can be degraded to simple molecules that are easily removed.

There continues to be a need to provide improved flexographic printing precursors that are easily manufactured without the use of process oils that have improved sensitivity (imaging speed) and provide improved print quality and run length.

SUMMARY OF THE INVENTION

The present invention includes an infrared radiation ablatable flexographic printing precursor that comprises an infrared radiation ablatable layer comprising a mixture of a high molecular weight ethylene-propylene-diene terpolymer (EPDM) rubber and a low molecular weight EPDM rubber.

In some embodiments, an infrared radiation ablatable flexographic printing precursor comprises an infrared radiation ablatable layer comprising from about 1 to about 20 weight % of a conductive carbon black having a dibutyl phthalate (DBP) adsorption of less than 110, and a mixture a high molecular weight ethylene-propylene-diene terpolymer (EPDM) rubber and a low molecular weight EPDM rubber, wherein the weight ratio of the high molecular weight EPDM to the low molecular weight EPDM rubber is from about 3:1 to about 5:1.

In still other embodiments, an infrared radiation ablatable flexographic printing precursor comprises an infrared radiation ablatable layer comprising one or more inorganic fillers, an infrared radiation absorbing material (such as a carbon black), and a mixture a high molecular weight ethylene-propylene-diene terpolymer (EPDM) rubber and a low molecular weight EPDM rubber, wherein the weight ratio of the high molecular weight EPDM to the low molecular weight EPDM rubber is from about 2:1 to about 10:1.

Other embodiments of this invention includes an infrared radiation ablatable flexographic printing precursor comprises an infrared radiation ablatable layer comprising a carbon black, one or more inorganic fillers, and a mixture of a high molecular weight ethylene-propylene-diene terpolymer (EPDM) rubber and a low molecular weight EPDM rubber, wherein the weight ratio of the carbon black to the inorganic filler(s) is from about 1:50 to about 1:1.5.

Still again, other embodiments of this invention include an infrared radiation ablatable flexographic printing precursor comprises an infrared radiation ablatable layer comprising:

from about 10 to about 35 weight % of one or more inorganic fillers and from about 1 to about 20 weight % of a carbon black, wherein the weight ratio of the carbon black to the inorganic filler(s) is from about 1:50 to about 1:1.5, and a mixture of a high molecular weight ethylene-propylene-diene terpolymer (EPDM) rubber and a low molecular weight EPDM rubber, wherein the weight ratio of the high molecular weight EPDM to the low molecular weight EPDM rubber is from about 2:1 to about 10:1.

This invention also provides a method of preparing the flexographic printing plate precursor of this invention comprising:

A) providing a mixture of a high molecular weight ethylene-propylene-diene terpolymer (EPDM) rubber and a low molecular weight EPDM rubber, B) adding optional components, and compounding the resulting mixture in a two-roll mill, C) applying the compounded mixture to a fabric base to provide a continuous roll of an infrared radiation ablatable layer, D) causing vulcanization in the continuous infrared radiation ablatable layer, E) laminating a polyester support to the continuous infrared radiation ablatable layer to provide a continuous laminated web, and F) grinding the infrared radiation ablatable layer.

In addition, a method of this invention for preparing the flexographic printing sleeve precursor of this invention comprises:

A) providing a mixture of a high molecular weight ethylene-propylene-diene terpolymer (EPDM) rubber and a low molecular weight EPDM rubber, B) adding optional components, and compounding the resulting mixture in a two-roll mill, C) applying the compounded mixture to a printing sleeve core to provide an infrared radiation ablatable sleeve, D) causing vulcanization in the infrared radiation ablatable sleeve, and E) smoothing the continuous infrared radiation ablatable sleeve to a uniform thickness.

A method of this invention for providing flexographic printing plate or sleeve comprising:

imaging the flexographic printing precursor of this invention using infrared radiation to provide a relief image in the infrared radiation ablatable layer.

In addition, this invention provides a system for providing a flexographic printing plate or printing sleeve, comprising:

the flexographic printing precursor of this invention, a group of one or more sources of imaging infrared radiation, each source capable of emitting infrared radiation, a set of optical elements coupled to the sources of imaging infrared radiation to direct imaging infrared radiation from the sources onto the flexographic printing precursor.

The present invention provides a laser engravable flexographic printing precursor that is readily manufactured without using process oils, and having improved image sensitivity, print quality, and run length.

Whereas prior art researchers have used high molecular weight EPDM rubber as well as other rubbery materials, they have failed to appreciate that its non-polar nature has made it particularly suitable as a basis for laser-engravable flexographic printing precursors and superior to other materials that are described in patents. Furthermore, we have found advantages from the inclusion of a low molecular weight EPDM polymer with the high molecular weight EPDM rubber, as a replacement for plasticizers. Low molecular weight EPDM provides the benefits of process oils in manufacture without the problems of leaching out either during grinding, printing or precursor storage.

We have also found that the use of the low molecular weight EPDM polymer causes an increase in crosslinking density in the rubber mixture with consequent advantages. For example, there is an improvement in compression set and mechanical properties such as tensile strength and elongation to the length at which the material breaks or snaps into at least two pieces (see ASTM D3759).

The present invention provides improved flexographic printing precursors that can be in the form of plates or sleeves. These precursors can be cleanly engraved using infrared radiation (lasers) to provide very sharp features in the resulting printed images. In addition, these precursors have improved run length and can be used for many high quality prints without degradation. These advantages are also provided by using a specific mixture of solid (high molecular weight) EPDM and liquid (low molecular weight) EPDM to formulate the infrared radiation ablatable layers.

DETAILED DESCRIPTION OF THE INVENTION

"Imaging" refers to ablation of the background areas while leaving intact the areas of the plate precursor that will be inked up and printed by flexography.

"Flexographic printing precursor" refers to a non-imaged flexographic element.

The terms "laser-ablatable element", "flexographic printing precursor", "flexographic printing plate precursor", and "flexographic printing sleeve precursor" used herein includes any imageable element or material of any form in which a relief image can be produced using a laser according to the present invention. In most instances, however, the laser-ablatable elements are used to form flexographic printing plates (flat sheets) or flexographic printing sleeves with a relief image having a relief depth of at least 100 μm. Such laser-ablatable, relief-forming elements may also be known as "flexographic printing plate blanks" or "flexographic sleeve blanks". The laser-ablatable elements can also be in seamless continuous forms.

By "ablative", we mean that the imageable (or infrared radiation ablatable) layer can be imaged using an infrared radiation source (such as a laser) that produces heat within the layer that causes rapid local changes in the infrared radiation-ablatable layer so that the imaged regions are physically detached from the rest of the layer or substrate and ejected from the layer and collected by a vacuum system. Non-imaged regions of the infrared radiation-ablatable layer are not removed or volatilized to an appreciable extent and thus form the upper surface of the relief image that is the printing surface. The breakdown is a violent process that includes eruptions, explosions, tearing, decomposition, fragmentation, oxidation, or other destructive processes that create a broad collection of materials. This is distinguishable from, for example, image transfer. "Ablation imaging" is also known as "ablation engraving" in this art. It is distinguishable from image transfer methods in which ablation is used to materially transfer an image by transferring pigments, colorants, or other image-forming components.

Unless otherwise indicated, the term "weight %" refers to the amount of a component or material based on the total dry layer weight of the composition or layer in which it is located.

The "top surface" is equivalent to the "relief-image forming surface" and is defined as the outermost surface of the infrared radiation-ablatable layer and is the first surface of that layer that is struck by imaging infrared radiation during the engraving or imaging process. The "bottom surface" is defined as the surface of the infrared radiation-ablatable layer that is most distant from the imaging infrared radiation.

Flexographic Printing Precursor

The flexographic printing precursors can include a self-supporting infrared radiation ablatable layer (defined below) that does not need a separate substrate to have physical integrity and strength. In such embodiments, this layer is thick enough and laser ablation is controlled in such a manner that the relief image depth is less than the entire thickness, for example at least 20% but less than 80% of the entire thickness.

However, in other embodiments, the flexographic printing precursor has a suitable dimensionally stable, non-laser ablatable substrate having an imaging side and a non-imaging side. The substrate has at least one infrared radiation ablatable layer disposed on the imaging side. Suitable substrates include dimensionally stable polymeric films, aluminum sheets or cylinders, transparent foams, ceramics, fabrics, or laminates of polymeric films (from condensation or addition polymers) and metal sheets such as a laminate of a polyester and aluminum sheet or polyester/polyamide laminates, or a laminate of a polyester film and a compliant or adhesive support. Polyester, polycarbonate, polyvinyl, and polystyrene films are typically used. Useful polyesters include but are not limited to poly(ethylene terephthalate) and poly(ethylene naphthalate). The substrates can have any suitable thickness, but generally they are at least 0.01 mm or from about 0.05 to about 0.3 mm thick, especially for the polymeric substrates. An adhesive layer may be used to secure the laser-ablatable layer to the substrate.

There may be a non-laser ablatable backcoat on the non-imaging side of the substrate (if present) that may be composed of a soft rubber or foam, or other compliant layer. This backcoat may be present to provide adhesion between the substrate and the printing press rollers and to provide extra compliance to the resulting printing plate, or to reduce or control the curl of the printing plate.

The flexographic printing precursor contains one or more layers. That is, it can contain multiple layers, at least one of which is an infrared radiation ablatable layer in which the relief image is formed. For example, there may be a non-laser ablatable elastomeric rubber layer (for example, a cushioning layer) between the substrate and the infrared radiation ablatable layer.

In most embodiments, the infrared radiation ablatable layer is the outermost layer, including embodiments where that layer is disposed on a printing cylinder as a sleeve. However, in some embodiments, the infrared radiation ablatable layer can be located underneath an outermost capping smoothing layer that provides additional smoothness or better ink reception and release. This smoothing layer can have a general thickness of from about 1 to about 200 μm.

In general, the infrared radiation ablatable layer has a thickness of at least 50 μm and generally from about 50 to about 4,000 μm, and typically from 200 to 2,000 μm.

The infrared radiation ablatable layer and formulation includes one or more high molecular weight ethylene-propylene-diene terpolymer (EPDM) rubbers. These rubbers generally have a molecular weight of from about 200,000 to about 800,000 and more typically from about 250,000 to about 500,000, or optimally, about 300,000. The high molecular weight rubbers are generally solid form and the molecular weight is at least 30 times (or even 50 times) higher than that of the low molecular weight EPDM rubbers. The high molecular weight EPDM rubbers can be obtained from a number of commercial sources as the following products: Keltan® EPDM (from DSM Elastomers) and Royalene® EPDM (from Lion Copolymers).

In addition, this layer includes one or more low molecular weight EPDM rubbers that are usually in liquid form, and having a molecular weight of from about 2,000 to about 10,000 and typically from about 2,000 to about 8,000. These components are also available from various commercial sources, for example as Trilene® EPDM (from Lion Copolymers).

These two essential components are present at a weight ratio (high molecular weight EPDM rubber to low molecular weight EPDM) of from about 2:1 to about 10:1, or from about 3:1 to about 5:1. Higher ratios do not affect the tack of the mixture sufficiently to permit good calendering and lower ratios give formulations that become too tacky and are consequently hard to handle, resulting in flexographic printing precursors that are too brittle for practical use.

The amount of the high molecular weight EPDM in the infrared radiation ablatable layer is generally at least 15 and up to and including 70 weight %, based on the total dry layer weight. More typically, the amount is from about 25 to about 45 weight %. Thus, all components other than the two EPDM rubbers are present in an amount of no more than 80 weight %, or typically no more than 60 weight %, based on the total dry layer weight.

The infrared radiation ablatable layer may also include minor amounts (less than 40 weight % of the total polymers or resins in the layer) of other "secondary" resins that are often included in laser-ablatable layers. These materials may need the presence of an intermediate bridging material to maintain compatibility. Such resins can include but are not limited to, crosslinked elastomeric or rubbery resins that are film-forming in nature. For example, the elastomeric resins can be thermosetting or thermoplastic urethane resins and derived from the reaction of a polyol (such as polymeric diol or triol)

with a polyisocyanate, or the reaction of a polyamine with a polyisocyanate. Alternatively, such polymers consist of a thermoplastic elastomer and a thermally initiated reaction product of a multifunctional monomer or oligomer.

Other elastomeric resins include copolymers of styrene and butadiene, copolymers of isoprene and styrene, styrene-butadiene-styrene block copolymers, styrene-isoprene-styrene copolymers, other polybutadiene or polyisoprene elastomers, nitrile elastomers, polychloroprene, polyisobutylene and other butyl elastomers, any elastomers containing chlorosulfonated polyethylene, polysulfide, polyalkylene oxides, or polyphosphazenes, elastomeric polymers of (meth)acrylates, elastomeric polyesters, and other similar polymers known in the art.

Still other useful secondary resins include vulcanized rubbers, such as Nitrile (Buna-N), Natural rubber, Neoprene or chloroprene rubber, silicone rubber, fluorocarbon rubber, fluorosilicone rubber, SBR (styrene-butadiene rubber), NBR (acrylonitrile-butadiene rubber), ethylene-propylene rubber, and butyl rubber.

Still other useful secondary polymers include but are not limited to, poly(cyanoacrylate)s that include recurring units derived from at least one alkyl-2-cyanoacrylate monomer and that forms such monomer as the predominant low molecular weight product during ablation. These polymers can be homopolymers of a single cyanoacrylate monomer or copolymers derived from one or more different cyanoacrylate monomers, and optionally other ethylenically unsaturated polymerizable monomers such as (meth)acrylate, (meth)acrylamides, vinyl ethers, butadienes, (meth)acrylic acid, vinyl pyridine, vinyl phosphonic acid, vinyl sulfonic acid, and styrene and styrene derivatives (such as α-methylstyrene), as long as the non-cyanoacrylate comonomers do not inhibit the ablation process. The monomers used to provide these polymers can be alkyl cyanoacrylates, alkoxy cyanoacrylates, and alkoxyalkyl cyanoacrylates. Representative examples of poly(cyanoacrylates) include but are not limited to poly(alkyl cyanoacrylates) and poly(alkoxyalkyl cyanoacrylates) such as poly(methyl-2-cyanoacrylate), poly(ethyl-2-cyanoacrylate), poly(methoxyethyl-2-cyanoacrylate), poly(ethoxyethyl-2-cyanoacrylate), poly(methyl-2-cyanoacrylate-co-ethyl-2-cyanoacrylate), and other polymers described in U.S. Pat. No. 5,998,088 (Robello et al.)

In other embodiments, the secondary polymers are an alkyl-substituted polycarbonate or polycarbonate block copolymer that forms a cyclic alkylene carbonate as the predominant low molecular weight product during depolymerization from ablation. The polycarbonate can be amorphous or crystalline as described for example in U.S. Pat. No. 5,156,938 (Foley et al.), Cols. 9-12.

The infrared radiation ablatable layer can also include one or more infrared (IR) radiation absorbing compounds that absorb IR radiation in the range of from about 750 to about 1400 nm or typically from 800 to 1250 nm as long as they do not interfere with the vulcanization process. Particularly useful infrared radiation absorbing compounds are responsive to exposure from IR lasers. Mixtures of the same or different types of infrared radiation absorbing compounds can be used if desired.

A wide range of infrared radiation absorbing compounds are useful in the present invention, including carbon blacks and other IR radiation absorbing organic or inorganic pigments (including squarylium, cyanine, merocyanine, indolizine, pyrylium, metal phthalocyanines, and metal dithiolene pigments), and metal oxides. Examples include RAVEN® 450, RAVEN® 760 ULTRA®, RAVEN® 890, RAVEN® 1020, RAVEN® 1250 and others that are available from Columbian Chemicals Co. (Atlanta, Ga.) as well as N 330 and N 772 that are available from Evonik Industries AG (Switzerland). Carbon blacks and especially conductive carbon blacks (described below) are particularly useful.

Useful IR radiation absorbing compounds also include carbon blacks that are surface-functionalized with solubilizing groups are well known in the art. Carbon blacks that are grafted to hydrophilic, nonionic polymers, such as FX-GE-003 (manufactured by Nippon Shokubai) are also useful. Other useful carbon blacks are Mogul L, Mogul E, Emperor 2000, and Regal® 330, and 400, all from Cabot Corporation (Boston Mass.). Other useful pigments include, but are not limited to, Heliogen Green, Nigrosine Base, iron(III)oxides, transparent iron oxides, magnetic pigments, manganese oxide, Prussian Blue, and Paris Blue. Other useful IR radiation absorbing compounds are carbon nanotubes, such as single- and multi-walled carbon nanotubes, graphite, grapheme, and porous graphite.

Conductive carbon blacks can also be used in the practice of this invention. Such carbon blacks can be acidic or basic in nature and can have a dibutyl phthalate (DBP) absorption value less than 110 (110 ml/100 g), as opposed to conductive carbon blacks having high DBP absorption values that are generally known for commercial conductive carbon blacks. Lower DBP absorption values are desirable because they provide lower viscosity of the infrared radiation ablatable layer formulations, making easier the manufacture of the flexographic printing precursors. Useful conductive carbon blacks can be obtained commercially as Ensaco™ 150 P (from Timcal Graphite and Carbon), Hi Black 160 B (from Korean Carbon Black Co. Ltd.), and N 293 (from Evonik Industries).

Electrically conductive carbon blacks with low DBP absorptions (as measured using ASTM D2414-82 DBP Absorption of Carbon Blacks) or low BET surface area (BET nitrogen surface area as measured by ASTM D 3037-89) are preferred. High DBP absorption or high surface area blacks produce formulations with too high a viscosity and cause handling problems during manufacture.

A finer dispersion of very small particles of pigmented IR radiation absorbing compounds can provide an optimum ablation feature resolution and ablation efficiency. Particularly suitable particles are those with diameters less than 1 μm.

Dispersants and surface functional ligands can be used to improve the quality of the carbon black or metal oxide, or pigment dispersion so that uniform incorporation of the IR radiation absorbing compound throughout the infrared radiation ablatable layer can be achieved.

The IR radiation absorbing compound(s), such as carbon blacks, are present in the infrared radiation ablatable layer generally in a total amount of at least 1 weight % and up to and including 20 weight %, and typically from about 2 to about 10 weight %, based on the total dry weight of the layer.

It is also possible that the infrared radiation absorbing compound (such as a carbon black) is not merely dispersed uniformly within the infrared radiation ablatable layer, but it is present in a concentration that is greater near the bottom surface than the image-forming surface. This concentration profile can provide a laser energy absorption profile as the depth into the infrared radiation ablatable layer increases. In some instances, the concentration change is continuously and generally uniformly increasing with depth. In other instances, the concentration is varied with layer depth in a step-wise manner. Further details of such arrangements of the IR radiation absorbing compound are provided in copending and commonly assigned U.S. Ser. No. 12/581,926 (filed Oct. 20, 2009 by Landry-Coltrain, Burberry, Perchak, Ng, Tutt, Rowley, and Franklin).

Thus, some embodiments of the present invention infrared radiation ablatable flexographic printing precursors comprise an infrared radiation ablatable layer comprising from about 1 to about 20 weight % (or from about 2 to about 10 weight %) of a conductive carbon black having a dibutyl phthalate (DBP) adsorption of less than 110, and a mixture a high molecular weight ethylene-propylene-diene terpolymer (EPDM) rubber and a low molecular weight EPDM rubber, wherein the weight ratio of the high molecular weight EPDM to the low molecular weight EPDM rubber is from about 3:1 to about 5:1. Non-conductive carbon blacks are also useful.

The infrared radiation ablatable layer can further comprise a carbon black and one or more inorganic fillers. Useful inorganic fillers include but are not limited to, silica, calcium carbonate, magnesium oxide, talc, barium sulfate, kaolin, bentonite, zinc oxide, mica, and titanium dioxide, and mixtures thereof. Thus, useful inorganic filler particles are silica and alumina, such as fine particulate silica, fumed silica, porous silica, surface treated silica, sold as Aerosil from Degussa and Cab-O—Sil from Cabot Corporation, micropowders such as amorphous magnesium silicate cosmetic microspheres sold by Cabot and 3M Corporation, calcium carbonate and barium sulfate particles and microparticles. Particularly useful fillers are zinc oxide, calcium carbonate, titanium dioxide, and silicas. The amount of inorganic fillers is generally at least 5 and up to and including 50 weight %, based on the total dry layer weight. However, more typically, the amount of inorganic fillers is from about 10 to about 35 weight %.

Contrary to the teaching in the prior art, for example, "Laser Engraving of Rubbers—The Influence of Fillers" by W. Kern et al., October 1997, 710-715 (Rohstoffe Und Anwendenunghen) describing EPDM formulations we have found that the use of inorganic fillers do not adversely affect sensitivity. This may be due to the presence of the lower molecular weight EPDM in the infrared radiation ablatable layer. Some fillers can also improve the mechanical properties of the precursor.

If both a carbon black and inorganic filler are present, the weight ratio of the carbon black to the inorganic filler(s) is from about 1:50 to about 1:1.5, or from about 1:20 to about 1:5. We have found that these ratios are particularly useful in the preparation of flexographic printing plate precursors even when the precursors have infrared radiation ablatable layers that are not based on EPDM elastomers.

It is also desirable that the infrared radiation ablatable layer further comprises a vulcanizer (or crosslinking agent) that can crosslink the EPDM rubbers and any other resins in the layer that can benefit from crosslinking Useful vulcanizers include but are not limited to, sulfur and sulfur-containing compounds, peroxide, hydroperoxides, and azo crosslinking agents. A mixture of sulfur and a peroxide can also be used, or a mixture of sulfur, a peroxide, and an azo crosslinking agent can be used. The amount of vulcanizer that can be present in the layer is at least 0.5% and up to and including 5 weight %, based on the total dry layer weight. Useful sulfur-containing compounds include but are not limited to, zinc dibutyl dithiocarbamate (ZDBC), tetramethylthiuram disulfide (TMTD), and tetramethylthiuram monosulfide (TMTM). Useful peroxides include but are not limited to, di(t-butylperoxyisopropyl) benzene, 2,5-dimethyl-2,5 bis(t-butyl)peroxy)hexane, dicumyl peroxide, and di(t-butyl)peroxide, and any others that can react with single carbon-carbon bonds and thus produce a higher curing density and better compression set.

Compression set is important because it represents the resistance to changes in printing by the printing plate being impacted on each printing impression followed by a brief recovery between printing. Peroxide vulcanization gives less odor than sulfur vulcanization.

There are certain materials, however, that should be avoided in the practice of this invention. Plasticizers such as mineral oils have been found to cause various problems. They tend to come to the surface during grinding and thus block the grinding medium. They also provide printing plates that may swell or lose material during long run printing and may sweat out during long term storage of the flexographic printing precursors. This sweating out of the plasticizer can reduce the adhesion between the infrared radiation ablatable layer and a polyester substrate causing debonding or delamination either during printing or when the printing plate is removed from the press after printing.

In some embodiments, microcapsules are dispersed within the infrared radiation ablatable layer. The "microcapsules" can also be known as "hollow beads", "hollow spheres", "microspheres", microbubbles", "micro-balloons", "porous beads", or "porous particles". Such components can include a thermoplastic polymeric outer shell and either core of air or a volatile liquid such as isopentane and isobutane. These microcapsules include a single center core or many voids within the core. The voids can be interconnected or non-connected. For example, non-laser-ablatable microcapsules can be designed like those described in U.S. Pat. No. 4,060,032 (Evans) and U.S. Pat. No. 6,989,220 (Kanga) in which the shell is composed of a poly[vinylidene-(meth)acrylonitrile] resin or poly (vinylidene chloride), or as plastic micro-balloons as described for example in U.S. Pat. No. 6,090,529 (Gelbart) and U.S. Pat. No. 6,159,659 (Gelbart).

The amount of microspheres that may be present is from about 2 to about 70 weight % of the total dry layer weight. The microspheres can comprise a thermoplastic shell that is either hollow inside or enclosing a hydrocarbon or low boiling liquid. For example, the shell can be composed of a copolymer of acrylonitrile and vinylidene chloride or methacrylonitrile, methyl methacrylate, or a copolymer of vinylidene chloride, methacrylic acid, and acrylonitrile. If a hydrocarbon is present within the microspheres, it can be isobutene or isopentane. EXPANCEL® microspheres are commercially available from Akzo Noble Industries (Duluth, Ga.). Dualite and Micropearl polymeric microspheres are commercially available from Pierce & Stevens Corporation (Buffalo, N.Y.). Hollow plastic pigments are available from Dow Chemical Company (Midland, Mich.) and Rohm and Haas (Philadelphia, Pa.). The microspheres generally have a diameter of 50 µm or less.

Inert microspheres can be hollow or filled with an inert solvent, and upon laser imaging, they burst and give a foam-like structure or facilitate ablation of material from the infrared radiation ablatable layer because they reduce the energy needed for ablation. Inert microspheres are generally formed of an inert polymeric or inorganic glass material such as a styrene or acrylate copolymer, silicon oxide glass, magnesium silicate glass, vinylidene chloride copolymers.

The amount of inert particulate materials or microspheres that can be present is from about 4 to about 70 weight % based on the total dry layer weight.

Optional addenda in the infrared radiation ablatable layer can include but are not limited to, dyes, antioxidants, antiozonants, stabilizers, dispersing aids, surfactants, and adhesion promoters, as long as they do not interfere with ablation efficiency or vulcanization.

An infrared radiation ablatable flexographic printing precursor comprises an infrared radiation ablatable layer comprising a carbon black, one or more inorganic fillers, and one or more elastomers, wherein the weight ratio of the carbon black to the inorganic filler(s) is from about 1:50 to about 1:1.5 (or from about 1:20 to about 1:5). The elastomers can include but are not limited to, copolymers of butadiene and styrene, copolymers of isoprene and styrene, styrene-diene-styrene block copolymers such as polystyrene-polybutadiene-polystyrene, polystyrene-polyisoprene-polystyrene, and polystyrene-poly(ethylenebutylene)-polystyrene. Elastomers also include non-crosslinked polybutadiene and polyisoprene, nitrile elastomers, polychloroprene, polyisobutylene and other butyl elastomers, chlorosulfonated polyethylene, polysulfide, polyalkylene oxides, polyphosphazenes, elastomeric polymers and copolymers of acrylates and methacrylates, elastomeric polyurethanes and polyesters, elastomeric polymers and copolymers of olefins such as ethylene-propylene copolymers and non-crosslinked EPDM, and elastomeric copolymers of vinyl acetate and its partially hydrogenated derivatives. In particular, the elastomers include a mixture of a high molecular weight ethylene-propylene-diene terpolymer (EPDM) rubber and a low molecular weight EPDM rubber, as described above.

The flexographic printing precursors of this invention can be prepared in the following manner:

The mixture of a high molecular weight ethylene-propylene-diene terpolymer (EPDM) rubber and a low molecular weight EPDM rubber is formulated with a desired weight ratio as described above. Additional components (such as inorganic fillers or a carbon black) can be added and the resulting mixture is then compounded using standard equipment for rubber processing (for example, a 2-roll mill or internal mixer of the Banbury type). During the mixing, the temperature can rise to 90° C. due to the high shear forces in the mixing apparatus. This process takes from 5 to 30 minutes depending upon the batch size, amount of inorganic fillers, type of rubber resin, and other factors known to a skilled artisan. Alternatively, it is desirable to incorporate a small quality of the inorganic filler(s) and a small quantity of the low molecular weight EPDM, until all of the ingredients are mixed with the high molecular weight EPDM rubber. The compounded mixture with the two rubbers and any other components (such as antioxidants, inorganic fillers, vulcanizers, carbon black), in their un-vulcanized state, are fed into a calender where a continuous sheet of rubber is deposited onto a carrier base (such as a fabric web) and wound into a continuous roll of infrared radiation ablatable layer on the fabric base. Controlling the rubber sheet thickness is accomplished by adjusting the pressure between the calender rolls and the calendaring speed. In some cases, where the rubbery mixture does not stick to the calender rolls, the rolls are heated to improve the tackiness of the rubber and to provide some adhesion to the calender rolls. This continuous roll of calendered material can be vulcanized in an autoclave under desired temperature and pressure conditions. For example, with a sulfur vulcanization system, the curing conditions are generally about 140° C. for up to 6 hours. Shorter times can be used if higher than atmospheric pressure is applied in the process. For peroxide curing systems, for example with Perkadox® 14/40 (Kayaku Akzo), the curing conditions would be about 175° C. for up to 6 hours.

The continuous infrared radiation ablatable layer is then laminated to a suitable support, such as a polyester film. The continuous infrared radiation ablatable layer can be ground using suitable continuous grinding apparatus to provide a uniform thickness in the continuous web. The web can then be cut to size to provide suitable flexographic printing precursors.

The process for making flexographic printing sleeves is similar but the compounded mixture is applied to a printing sleeve core to provide an infrared radiation ablatable sleeve. This sleeve is then vulcanized in a suitable manner, and can be ground to a uniform thickness using suitable equipment.

The flexographic printing precursor can also be constructed with a suitable protective layer or slip film (with release properties or a release agent) in a cover sheet that is removed prior to ablation imaging. Such a protective layer can be a polyester film [such as poly(ethylene terephthalate)] forming the cover sheet. A backing layer on the substrate side opposite the infrared radiation ablatable layer can also be present.

Laser Ablation Imaging

Ablation energy is preferably applied using an IR radiation emitting diode but carbon dioxide or Nd:YAG lasers can also be used. Ablation to provide a relief image with a minimum depth of at least 50 μm is desired with a relief image having a minimum depth of at least 100 μm or a typical depth of from 300 to 1000 μm or up to 600 μm being desirable. The relief image may have a maximum depth up to about 100% of the original thickness of the infrared radiation ablatable layer when a substrate is present. In such instances, the floor of the relief image may be the substrate (if the ablatable layer is completely removed in the imaged regions), a lower region of the infrared radiation ablatable layer, or an underlayer such as an adhesive layer or compliant layer. When a substrate is absent, the relief image may have a maximum depth of up to 80% of the original thickness of the original ablatable layer. An IR diode laser operating at a wavelength of from about 700 to about 1400 nm is generally used, and a diode laser operating at from 800 nm to 1250 nm is useful for ablative imaging.

Generally, ablation imaging is achieved using at least one infrared radiation laser having a minimum fluence level of at least 20 J/cm$^2$ at the element surface and typically infrared imaging is at from about 20 to about 1000 J/cm$^2$ or typically from 50 to 800 J/cm$^2$.

A suitable laser engraver that would provide satisfactory ablation is described in WO 2007/149208 (Eyal et al.) that is incorporated herein by reference. This laser engraver is considered to be a "high power" laser ablating imager or engraver and has at least two laser diodes emitting radiation in one or more wavelengths so that imaging with the one or more wavelengths is carried out at different depths relative to the precursor surface. For example, the multi-beam optical head described in this publication incorporates numerous laser diodes each having a power in the order of at least 10 Watts per emitter width of 100 μm. These lasers can be modulated directly at relatively high frequencies without the need for external modulators.

Thus, ablative imaging can be carried out at the same or different depths relative to the surface of the infrared radiation ablatable layer using two or more laser diodes each emitting radiation in one or more wavelengths.

Other imaging (or engraving) devices and components thereof and methods are described for example in U.S. Patent Application Publications 2008/0153038 (Siman-Tov et al.) describing a hybrid optical head for direct engraving, 2008/0305436 (Shishkin) describing a method of imaging one or more graphical pieces in a flexographic printing plate precursor on a drum, 2009/0057268 (Aviel) describing imaging devices with at least two laser sources and mirrors or prisms put in front of the laser sources to alter the optical laser paths, and 2009/0101034 (Aviel) describing an apparatus for providing an uniform imaging surface, all of which publications are incorporated herein by reference. In addition, copending and commonly assigned U.S. Ser. No. 12/502,267 (filed Jul. 14, 2009 by Matzner, Aviel, and Melamed) describes an engraving system including an optical imaging head, a printing plate construction, and a source of imaging radiation, which copending application is incorporated herein by reference. Copending and commonly assigned U.S. Serial No. 12/555,003 (filed Sep. 8, 2009 but Aviel and Eyal) describes an imaging head for 3D imaging of flexographic printing plate precursors using multiple lasers, which copending application is also incorporated herein by reference.

Thus, a system for providing flexographic printing plates or sleeves include one or more of the flexographic printing precursors described above, as well as one or more groups of one or more sources of imaging infrared radiation, each source capable of emitting infrared radiation (see references cited above). Such imaging sources can include but are not limited to, laser diodes, multi-emitter laser diodes, laser bars, laser stacks, fiber lasers, or a combination thereof. The system can also include one or more sets of optical elements coupled to the sources of imaging infrared radiation to direct imaging infrared radiation from the sources onto the flexographic printing precursor (see references cited above for examples of optical elements).

Ablation to form a relief image can occur in various contexts. For example, sheet-like elements can be imaged and used as desired, or wrapped around a printing sleeve core or cylinder form before imaging. The flexographic printing precursor can also be a printing sleeve that can be imaged.

During imaging, products of ablation can be gaseous or volatile and readily collected by vacuum for disposal or chemical treatment. Any solid debris from ablation can be collected and removed using suitable means such as vacuum, compressed air, brushing with brushes, rinsing with water, ultrasound, or any combination of these.

During printing, the resulting flexographic printing plate or printing sleeve is inked using known methods and the ink is appropriately transferred to a suitable substrate such as paper, plastics, fabrics, paperboard, or cardboard.

After printing, the flexographic printing plate or sleeve can be cleaned and reused and a printing cylinder can be scraped or otherwise cleaned and reused as needed. Cleaning can be accomplished with compressed air, water, or a suitable aqueous solution, or by rubbing with cleaning brushes or pads.

The present invention provides at least the following embodiments and combinations thereof:

1. An infrared radiation ablatable flexographic printing precursor that comprises an infrared radiation ablatable layer comprising a mixture of a high molecular weight ethylene-propylene-diene terpolymer (EPDM) rubber and a low molecular weight EPDM rubber.

2. The precursor of embodiment 1 wherein the weight ratio of the high molecular weight EPDM to the low molecular weight EPDM rubber is from about 2:1 to about 10:1.

3. The precursor of embodiment 1 or 2 wherein the weight ratio of the high molecular weight EPDM to the low molecular weight EPDM rubber is from about 3:1 to about 5:1.

4. The precursor of any of embodiments 1 to 3 wherein the molecular weight of the high molecular weight EPDM is from about 200,000 to about 800,000, and the molecular weight of the low molecular weight EPDM is from about 2,000 to about 10,000.

5. The precursor of any of embodiments 1 to 4 wherein the molecular weight of the high molecular weight EPDM is from about 250,000 to about 500,000, and the molecular weight of the low molecular weight EPDM is from about 2,000 to about 8,000.

6. The precursor of any of embodiments 1 to 5 wherein the infrared radiation ablatable layer further comprises a carbon black.

7. The precursor of any of embodiments 1 to 6 wherein the infrared radiation ablatable layer further comprises a conductive carbon black.

8. The precursor of any of embodiments 1 to 7 wherein the infrared radiation ablatable layer further comprises a conductive carbon black having a dibutyl phthalate (DBP) absorption of less than 110.

9. The precursor of embodiments 1 to 6 wherein the infrared radiation ablatable layer further comprises a non-conductive carbon black.

10. An infrared radiation ablatable flexographic printing precursor comprises an infrared radiation ablatable layer comprising from about 1 to about 20 weight % of a conductive carbon black having a dibutyl phthalate (DBP) adsorption of less than 110, and a mixture of a high molecular weight ethylene-propylene-diene terpolymer (EPDM) rubber and a low molecular weight EPDM rubber, wherein the weight ratio of the high molecular weight EPDM to the low molecular weight EPDM rubber is from about 3:1 to about 5:1.

11. The precursor of embodiment 10 wherein the infrared radiation ablatable layer comprises from about 2 to about 10 weight % of the conductive carbon black.

12. The precursor of any of embodiments 1 to 11 wherein the infrared radiation ablatable layer further comprises a vulcanizer 13. The precursor of any of embodiment 12 wherein the infrared radiation ablatable layer further comprises sulfur or a peroxide as a vulcanizer and an azo crosslinking agent, or a mixture of sulfur and a peroxide, or a mixture of sulfur, an azo crosslinking agent, and a peroxide.

14. The precursor of any of embodiments 1 to 13 further comprising a polyester support upon which the infrared radiation ablatable layer is disposed.

15. The precursor of any of embodiments 1 to 14 further comprising a fabric support upon which the infrared radiation ablatable layer is disposed.

16. The precursor of embodiment 15 wherein the fabric support is disposed on a polyester support.

17. An infrared radiation ablatable flexographic printing precursor comprises an infrared radiation ablatable layer comprising one or more inorganic fillers, a carbon black, and a mixture of a high molecular weight ethylene-propylene-diene terpolymer (EPDM) rubber and a low molecular weight EPDM rubber, wherein the weight ratio of the high molecular weight EPDM to the low molecular weight EPDM rubber is from about 2:1 to about 10:1.

18. The precursor of any of embodiments 1 to 17 wherein the infrared radiation ablatable layer further comprises one or more inorganic fillers that are chosen from silica, calcium carbonate, barium sulfate, kaolin, bentonite, zinc oxide, mica, and titanium dioxide.

19. An infrared radiation ablatable flexographic printing precursor comprises an infrared radiation ablatable layer comprising:

from about 10 to about 35 weight % of one or more inorganic fillers and from about 1 to about 20 weight % of a carbon black, wherein the weight ratio of the carbon black to the inorganic filler(s) is from about 1:50 to about 1:1.5, and a mixture of a high molecular weight ethylene-propylene-diene terpolymer (EPDM) rubber and a low molecular weight EPDM rubber, wherein the weight ratio of the high molecular weight EPDM to the low molecular weight EPDM rubber is from about 2:1 to about 10:1.

20. A method of preparing the flexographic printing plate precursor of any of embodiments 1 to 19 comprising:

A) providing a mixture of a high molecular weight ethylene-propylene-diene terpolymer (EPDM) rubber and a low molecular weight EPDM rubber, B) adding optional components, and compounding the resulting mixture in a two-roll mill, C) applying the compounded mixture to a fabric base to provide a continuous roll of an infrared radiation ablatable layer, D) causing vulcanization in the continuous infrared radiation ablatable layer, E) laminating a polyester support to the continuous infrared radiation ablatable layer to provide a continuous laminated web, and F) grinding the infrared radiation ablatable layer.

21. The method of embodiment 20 wherein the infrared radiation ablatable layer is ground in the continuous laminated web to a uniform thickness.

22. The method of embodiment 20 or 21 wherein the mixture of high molecular with EPDM and low molecular weight EPDM further comprises a carbon black in an amount of from about 1 to about 20 weight %, and the weight ratio of the high molecular weight EPDM rubber to the low molecular weight EPDM rubber is from about 2:1 to about 10:1.

23. The method of any of embodiments 20 to 22 wherein the mixture of high molecular with EPDM and low molecular weight EPDM further comprises one or more inorganic fillers, a vulcanizer, or both an inorganic filler and a vulcanizer.

24. The method of any of embodiments 20 to 23 wherein the continuous laminated web further comprises a fabric layer between the polyester support and the continuous infrared radiation ablatable layer.

25. A method of preparing the flexographic printing sleeve precursor of any of embodiments 1 to 19 comprising:

A) providing a mixture of a high molecular weight ethylene-propylene-diene terpolymer (EPDM) rubber and a low molecular weight EPDM rubber, B) adding optional components, and compounding the resulting mixture in a two-roll mill, C) applying the compounded mixture to a printing sleeve core to provide an infrared radiation ablatable sleeve, D) causing vulcanization in the infrared radiation ablatable sleeve, and E) smoothing the continuous infrared radiation ablatable sleeve to a uniform thickness.

26. The method of embodiment 25 wherein the mixture of high molecular weight EPDM and low molecular weight EPDM further comprises a carbon black, and optionally one or more inorganic fillers and a vulcanizer 27. A method of providing flexographic printing plate or sleeve comprising:

imaging the flexographic printing precursor of any of embodiments 1 to 19 using infrared radiation to provide a relief image in the infrared radiation ablatable layer.

28. The method of embodiment 27 wherein imaging is carried out using a laser at a power of at least 20 J/cm$^2$.

29. The method of embodiment 27 or 28 further comprising removal of debris after imaging.

30. The method of embodiment 29 wherein debris is removed by vacuum, compressed air, brushes, rinsing with water, ultrasound, or any combination of these.

31. The method of any of embodiments 27 to 30 wherein imaging is carried out using a high power laser ablating imager.

32. The method of any of embodiments 27 to 31 wherein imaging is carried out at the same or different depths relative to the surface of the infrared radiation ablatable layer using two or more laser diodes each emitting radiation in one or more wavelengths.

33. A system for providing a flexographic printing plate or printing sleeve, comprising:

the flexographic printing precursor of any of embodiments 1 to 19, a group of one or more sources of imaging infrared radiation, each source capable of emitting infrared radiation, a set of optical elements coupled to the sources of imaging infrared radiation to direct imaging infrared radiation from the sources onto the flexographic printing precursor.

34. The system of embodiment 33 wherein the sources of imaging infrared radiation are laser diodes, multi-emitter laser diodes, laser bars, laser stacks, fiber lasers, or a combination thereof 35. An infrared radiation ablatable flexographic printing precursor comprises an infrared radiation ablatable layer comprising a carbon black, one or more inorganic fillers, and one or more elastomers, wherein the weight ratio of the carbon black to the inorganic filler(s) is from about 1:50 to about 1:1.5.

36. The precursor of embodiment 35 wherein the elastomers includes a mixture of a high molecular weight ethylene-propylene-diene terpolymer (EPDM) rubber and a low molecular weight EPDM rubber.

37. The precursor of embodiment 35 or 36 wherein the weight ratio of the carbon black to the inorganic filler(s) is from about 1:20 to about 1:5

The following Examples are provided to illustrate the present invention and are not to be limiting in any manner.

EXAMPLES

Comparisons of commercially available laser-ablatable flexographic printing plate precursors were made to flexographic printing plate precursors of the present invention as described below. The comparison method was to measure the depth of engraving under standard conditions using a laser diode engraver with a constant drum angular velocity of 100 rpm and constant laser power of 4.5 watts. Typical engraving depths for the commercial printing plate precursors were compared to the precursors made according to Invention Example 1 and the data are as follows:

| Printing Plate Precursor | Engraving depth (μm) |
| --- | --- |
| Invention Example 1 | 64 |
| Comparative Example 1 (Bottcher SBR) | 47 |
| Comparative Example 2 (Printec) | 45 |

Surface Evenness:

The demands on achieving high surface evenness have increased because of the need to accurately reproduce delicate half tones. Thus, for instance, U.S. Pat. No. 5,798,202 (noted above) specifically teaches away from the use of vulcanized rubbers because the resulting flexographic printing plate precursors must be ground down to a uniform surface. Grinding is time-consuming. However, we have found that it is not possible to reach the high level of surface evenness without grinding and have found a method of doing so in a continuous manner to continuous forms, thus minimizing the time necessary for grinding and thereby making it commercially viable.

In addition to the production of even surfaces, investigation has also determined that the unground surface of the flexographic precursor tends to be smooth and shiny due to the formation of a continuous surface film over any pigment in the outer layer. Grinding has the effect of disrupting this film so that the oleophilic pigment such as carbon black, which is present in more completely exposed regions, imparts improved ink accepting properties to the flexographic precursor. In addition, grinding produces a very accurate flexographic precursor thickness that improves printing performance. We found it necessary to provide laser-engravable formulations that will have optimized printing properties when the printing surface has been ground. Also, we found that successful grinding is dependent upon the laser-engravable formulation. For instance, the presence of plasticizers, such as process oils (mineral oils) that are regarded in the rubber industry as essential for calendering to produce standard sheets of rubber, causes severe problems if the sheets must be ground, as is the case for the high quality flexographic precursors of the present invention. During grinding, flexographic precursors containing mineral oils produce a sticky mixture of oil and ground rubber that clogs the medium used for grinding, making continuous grinding impossible.

Print Quality:

While print quality can be qualitatively assessed overall and quantitatively measured by certain parameters, it is difficult to predict how a given laser-engravable formulation may affect this. Optical density of solid print areas is an important parameter. Sharpness is partially defined by distinguishable line width and the comparative examination of 2-point text under a low-powered microscope.

Means of Flexographic Printing Precursor Production:

Top quality printing requires high quality flexographic plate and sleeve production, and thus methods of production described in the art are not sufficiently reliable for use in the present invention. For example, production by laying down multiple layers from solvents would be too prone to the incidence of solvent bubbles during the drying process in which the solvent is removed from the coating. Whereas vulcanization is a proven method that may involve extrusion and calendering without the danger of clogging during compounding, catalysis of reactions such as urethane formation during compounding and possible extrusion can cause blocking of the production equipment. U.S. Pat. No. 5,798,202 describes a variety of methods for flexographic printing precursor production but does not appreciate that the combination of extrusion, calendering, and grinding is the only method that will produce sufficient flexographic precursor quality.

In some prior art, processing oils are used in laser-ablatable flexographic printing plates. However, such formulations cause problems during continuous grinding procedures. On the other hand, processing oils are needed for the production of EPDM sheets. Without such oils, EPDM is too dry and hard and does not adhere sufficiently to the calendar rollers for proper calendering. The processing oils promote good calendering by improving tack and by lowering the viscosity. However, the processing oils introduce other problems and inhibit long print run capability. The present invention solves this problem of calendering, grinding, and run length by including a low molecular weight EPDM in the laser-engravable formulation.

Long Run Length Capability:

The use of flexographic printing in the packaging industry frequently requires long printing runs for consumer products such as packaging of food-stuffs. Many known laser-engravable flexographic printing plate precursors include plasticizers. The printing process utilizes inks based on solvent mixtures or water. During long printing runs, plasticizers may be extracted by the inks solvents and the ink solvents absorbed. Due to these effects, flexographic printing precursors will change in durometer hardness and may either swell or shrink. Any changes will affect the quality of prints, making it variable. Consequently, the choice of materials in the laser-engravable layer (such as the elastomer) is important. Historically, this importance is not been fully appreciated in the art and the inclusion of plasticizers show a lack of appreciation for the highest standards of retention of integrity of the formulation during the print run. We found that such plasticizers leach out during long print runs as well as during the process of grinding when the precursors are being prepared.

Invention Example 1

One hundred parts by weight of an EPDM rubber was masticated in a two roller mill. The grade of EPDM as based on ethylidene norborene and was the commercial grade KEP240 (sold by Kumho). Mastication was continued until the shapeless lump placed in the mill had been formed into a semi-transparent sheet. This sheet was rolled up and fed into a Banbury mixer operating at between 70 and 80° C. During this mixing, the following components (parts by weight) were added individually in the order shown below.

| Stearic Acid | 1.0 part |
| Zinc oxide | 6.25 parts |
| Carbon black | 12.0 parts |

The following two ingredients were then added, approximately one third at a time, firstly one third of the silica, one third of the liquid EPDM rubber, and then the next third of the silica and so on until the quantities had been completely added

| Silica | 30 parts |
| Trilene 67 EPDM | 20 parts |

Trilene 67 is a liquid EPDM rubber sold by Lion Polymers and has a molecular weight of approximately 7700 and a Brookfield viscosity at 100° C. of 128,000.

The entire mixture was mixed for approximately 20 minutes in the Banbury mixer until a constant stress reading could be observed on the Banbury mixer. The resulting material was removed from the Banbury mixer as a homogenous lump that was fed onto a two roller mill and the following materials added were then added:

6 parts by weight of a silane coupling agent, bis[3-(triethoxysilyl)propyl]polysulfide, 10 parts by weight of di-(t-butylperoxyisopropyl)benzene, and 1.5 parts of 2,4,6-triallyoxy-1,3,5-triazine co-agent.

The Mooney viscosity of the resulting mixture was about 53. Mooney viscosities need to be between 30 and 80 or more preferably, between 40 and 60. Higher and lower viscosities than these values will not allow processability on a two roller mill.

The milled material was then fed through a calendar at a temperature of 30-80° C. together with a fabric base. The calendar gap was pre-set to the thickness requirements. The resulting roll of laminated rubber and fabric was fed into an autoclave at 135° C. for a period of time. After cooling the roll to room temperature, it was laminated to a 125 µm poly (ethylene terephthalate) film and post cured in an autoclave at 120° C.

The completed flexographic printing plate precursor was continuously ground on the non-polyester side to a uniform thickness by a buffing machine.

The precursor was cut to an appropriate size and placed on a laser ablating plate imager where excellent sharp deep relief images were produced that were used on a flexographic printing press to produce hundreds of thousands of sharp, clean impressions. The compression set for this printing plate precursor was measured according to ASTM D 395 Method B and found to be 13%.

Comparative Example 1

Invention Example 1 was repeated but a mineral oil was substituted for the liquid EPDM rubber. Although the formulation was processable to form flexographic printing precursor sheets, they could not be ground to give good evenness in the laser-ablatable surface.

In addition, when the sheets were soaked in a solvent mixture of ethyl acetate (20%) and isopropanol (80%) for 24 hours, we determined that the mineral oil leached out with a weight loss of 1.5% compared to 0% loss from the flexographic printing plate precursors of Invention Example 1. Measurements of swelling showed that the Invention Example 1 flexographic printing precursor swelled by 3.2% while the Comparative Example 1 precursor swelled by 4.6%.

Comparative printing tests showed that the Invention Example 1 flexographic printing plates provided better ink transfer, less dot gain that can be seen in smaller sharper 50% dots, thinner 50 µm lines, and more constant print quality for the $100^{th}$ impression as compared to the $10,000^{th}$ impression.

The Invention Example 1 precursor had a Taber abrasion weight loss per cycle of 0.350 mgr compared to the Comparative Example 1 precursor value of 0.447 mgr. The compression set for this printing plate precursor was measured according to ASTM D 395 Method B and found to be 19%.

Comparative Example 2

Invention Example 1 was repeated, but SBR 1502 rubber was substituted for the EPDM rubber mixture. The SBR 1502 rubber required no addition of mineral oil to make it manufacturable but it exhibited a swelling of 9.9% using the test described in Comparative Example 1.

The invention has been described in detail with particular reference to certain preferred embodiments thereof, but it will be understood that variations and modifications can be effected within the spirit and scope of the invention.

The invention claimed is:

1. A method of preparing a flexographic printing plate precursor, comprising:
   providing a mixture of EPDM rubbers consisting essentially of of a high molecular weight ethylene-propylene-diene terpolymer (EPDM) rubber and a low molecular weight EPDM rubber,
   adding a peroxide or hydroperoxide vulcanizer and optional components to the mixture of EPDM rubbers, and compounding the resulting mixture in a mixer to form a compounded mixture, wherein the compounded mixture contains no mineral oil plasticizer,
   calendering the compounded mixture to provide a continuous sheet of an infrared radiation ablatable layer,
   causing vulcanization in the continuous infrared radiation ablatable layer, and
   grinding the infrared radiation ablatable layer,
      wherein the compounded mixture further comprises a carbon black in an amount of from about 1 to about 20 weight %, and one or more inorganic fillers at a weight ratio of carbon black to inorganic filler of from 1:20 to 1:5.

2. The method of claim 1 wherein the infrared radiation ablatable layer is ground to a uniform thickness, and optionally laminating the infrared radiation ablatable layer to a base after vulcanizing.

3. The method of claim 1 wherein the weight ratio of the high molecular weight EPDM rubber to the low molecular weight EPDM rubber is from about 2:1 to about 10:1.

4. The method of claim 1 wherein the compounded mixture comprises a peroxide and crosslinking agent.

5. The method of claim 1 wherein the continuous sheet comprises a fabric layer between a polyester support and the continuous infrared radiation ablatable layer.

6. The method of claim 1 wherein the weight ratio of the high molecular weight ethylene-propylene-diene terpolymer (EPDM) rubber to the low molecule weight EPDM rubber in the mixture of EPDM rubber is from 3:1 to 5:1.

7. A method of preparing a flexographic printing sleeve precursor, comprising:
   providing a mixture of EPDM rubber consisting essentially of a high molecular weight ethylene-propylene-diene terpolymer (EPDM) rubber and a low molecular weight EPDM rubber,
   adding a peroxide or hydroperoxide and optional components to the mixture of EPDM rubber, and compounding the resulting mixture in a mixer to provide a compounded mixture, wherein the compounded mixture contains no mineral oil plasticizer,
   applying the compounded mixture to a printing sleeve core to provide an infrared radiation ablatable sleeve,
   causing vulcanization in the infrared radiation ablatable sleeve, and
   smoothing the continuous infrared radiation ablatable sleeve to a uniform thickness,
      wherein the compounded mixture further comprises a carbon black and one or more inorganic fillers in a weight ratio of carbon black to inorganic filler of from 1:20 to 1:5.

8. The method of claim 7 wherein the compounded mixture comprises a peroxide and crosslinking agent.

9. The method of claim 7 wherein the weight ratio of the high molecular weight ethylene-propylene-diene terpolymer (EPDM) rubber to the low molecule weight EPDM rubber in the mixture of EPDM rubber is from 3:1 to 5:1.

* * * * *